United States Patent
Dozorets et al.

(10) Patent No.: US 7,627,843 B2
(45) Date of Patent: *Dec. 1, 2009

(54) DYNAMICALLY INTERLEAVING RANDOMLY GENERATED TEST-CASES FOR FUNCTIONAL VERIFICATION

(75) Inventors: Igor Dozorets, Nesher (IL); Roy Emek, Tel Aviv-Jaffa (IL); Sanjay Gupta, Austin, TX (US); Itai Jaeger, Lavon (IL); Lawrence Allyn McConville, Austin, TX (US); Tzach Schechner, Tel Aviv (IL); Todd Swanson, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 462 days.

This patent is subject to a terminal disclaimer.

(21) Appl. No.: 11/087,466

(22) Filed: Mar. 23, 2005

(65) Prior Publication Data

US 2006/0218513 A1 Sep. 28, 2006

(51) Int. Cl.
G06F 9/00 (2006.01)

(52) U.S. Cl. .................. 716/5; 716/4; 714/30; 714/738; 714/739; 714/742; 702/118; 717/124; 703/22

(58) Field of Classification Search .................. 703/14, 703/22; 716/4, 5; 717/100, 124; 714/30, 714/738, 739, 741, 756; 702/118
See application file for complete search history.

(56) References Cited

U.S. PATENT DOCUMENTS

| | | | | |
|---|---|---|---|---|
| 5,774,358 A * | 6/1998 | Shrote | | 700/86 |
| 5,809,108 A * | 9/1998 | Thompson et al. | | 379/10.02 |
| 5,940,472 A * | 8/1999 | Newman et al. | | 379/10.02 |
| 5,978,940 A * | 11/1999 | Newman et al. | | 714/712 |
| 6,002,869 A * | 12/1999 | Hinckley | | 717/124 |
| 6,002,871 A * | 12/1999 | Duggan et al. | | 717/135 |
| 6,212,667 B1 * | 4/2001 | Geer et al. | | 716/6 |
| 6,453,276 B1 * | 9/2002 | Bauman | | 703/15 |
| 6,574,578 B1 * | 6/2003 | Logan | | 702/122 |
| 6,757,882 B2 * | 6/2004 | Chen et al. | | 716/12 |
| 6,775,824 B1 * | 8/2004 | Osborne et al. | | 717/125 |
| 6,785,876 B2 * | 8/2004 | Takemura | | 716/7 |
| 6,871,298 B1 * | 3/2005 | Cavanaugh et al. | | 714/33 |
| 6,993,747 B1 * | 1/2006 | Friedman | | 717/124 |
| 7,000,224 B1 * | 2/2006 | Osborne et al. | | 717/125 |

(Continued)

OTHER PUBLICATIONS

R. Emek, Y. Naveh, "Scheduling of Transactions for System-Level Test Case Generation" 2003 IEEE.*

(Continued)

Primary Examiner—Kamini S Shah
Assistant Examiner—Kibrom K Gebresilassie

(57) ABSTRACT

The input for a test generator is a plurality of test templates, each of which typically aims at covering a specific verification task. Test templates direct the production of distinct transactions, which are the atomic functional building blocks of the design-under-verification. Test templates directed to different hardware functions of the scenario are dynamically interleaved. In this way several transactions are combined together in complex statements in order to achieve a complex test scenario. The transactions are submitted to the test generator, which generates test cases, in which the different hardware functions of the scenario are exercised in combinations. Variation among the test cases is achieved through a large number of random decisions made during the generation process.

13 Claims, 3 Drawing Sheets

U.S. PATENT DOCUMENTS

| | | | |
|---|---|---|---|
| 7,027,971 B2 * | 4/2006 | Gabele et al. | 703/14 |
| 7,133,816 B2 * | 11/2006 | Adir et al. | 703/14 |
| 7,231,616 B1 * | 6/2007 | Mohanty et al. | 716/4 |
| 7,299,382 B2 * | 11/2007 | Jorapur | 714/38 |
| 7,434,101 B2 * | 10/2008 | Adir et al. | 714/33 |
| 7,496,876 B1 * | 2/2009 | Selvam | 716/5 |
| 2002/0029377 A1 * | 3/2002 | Pavela | 717/124 |
| 2003/0130813 A1 * | 7/2003 | Adir et al. | 702/119 |
| 2003/0130831 A1 * | 7/2003 | Adir | 703/22 |
| 2003/0204784 A1 * | 10/2003 | Jorapur | 714/38 |
| 2004/0078742 A1 * | 4/2004 | Emek et al. | 714/728 |
| 2004/0133858 A1 * | 7/2004 | Barnett et al. | 715/530 |
| 2004/0143819 A1 * | 7/2004 | Cheng et al. | 717/125 |
| 2004/0261050 A1 * | 12/2004 | Broberg et al. | 716/18 |
| 2005/0144529 A1 * | 6/2005 | Gotz et al. | 714/38 |
| 2005/0203720 A1 * | 9/2005 | Lagoon et al. | 703/2 |
| 2006/0212756 A1 * | 9/2006 | Emek et al. | 714/30 |
| 2008/0126070 A1 * | 5/2008 | Copty et al. | 703/22 |
| 2008/0177968 A1 * | 7/2008 | Emek et al. | 711/170 |

OTHER PUBLICATIONS

N. Malik, S. Roberts, A. Pita, and R. Dobson, "Automation: an Autonomous Coverage Multiprocessor System Verification Environment" Feb. 26, 2004.*

E. Bin. R. Emek, G. Shurek, A. Ziv, "Using a constraint satisfaction formulation and solution techniques for random test program generation" IBM Systems Journal, vol. 41, No. 3, 2002.*

A. E. Ilowe, A. V.Mayriiauser, R. T. Mraz, "Test Case Generation as an AI Planning Problem", 1991.*

R. Emek, I. Jaeger, Y. Katz, and Y. Naveh, "Quality Improvement Methods for System-level Stimuli Generation", pp. 1-3, 2004 IEEE.*

L. Fournier, Y. Arbetman, M. Levinger, "Functional Verification Methodology for Microprocessors Using the Genesys Test-Program Generator", pp. 1-8, Functional Verification Methodology, Dec. 17, 1998.*

R. Emek, I. Jaeger, Y. Katz, and Y. Naveh, "Quality Improvement Methods for System-level Stimuli Generation", IEEE International Conference on Computer Design, 2004.*

Grinwald, R. et al., "User Defined Coverage—A Tool Supported Methodology for Design Verification", Proceedings of 38th Design Automation Conference (DAC98), Jun. 15-19, 1998, pp. 158-163.

Lichtenstein, Y. et al, "Model Based Test Generation for Processor Verification", Innovative Applications of Artificial Intelligence (IAAI), AAAI Press, 1994.

Lewin, Daniel et al., "Constraint Satisfaction for Test Program Generation", Int. Phoenix Conference on Computers and Communications, Mar. 1995.

Aharon, A. et al., "Test Program Generation for Functional Verification of PowerPC Processors in IBM", 32nd Design Automation Conference, San Francisco, Jun. 1995, pp. 279-285.

Emek, Roy et al., "X-Gen: A Random Test-Case Generator for Systems and SoCs", IEEE International High Level Design Validation and Test Workshop (HLDVT), pp. 145-150, Oct. 2002, Cannes, France.

* cited by examiner

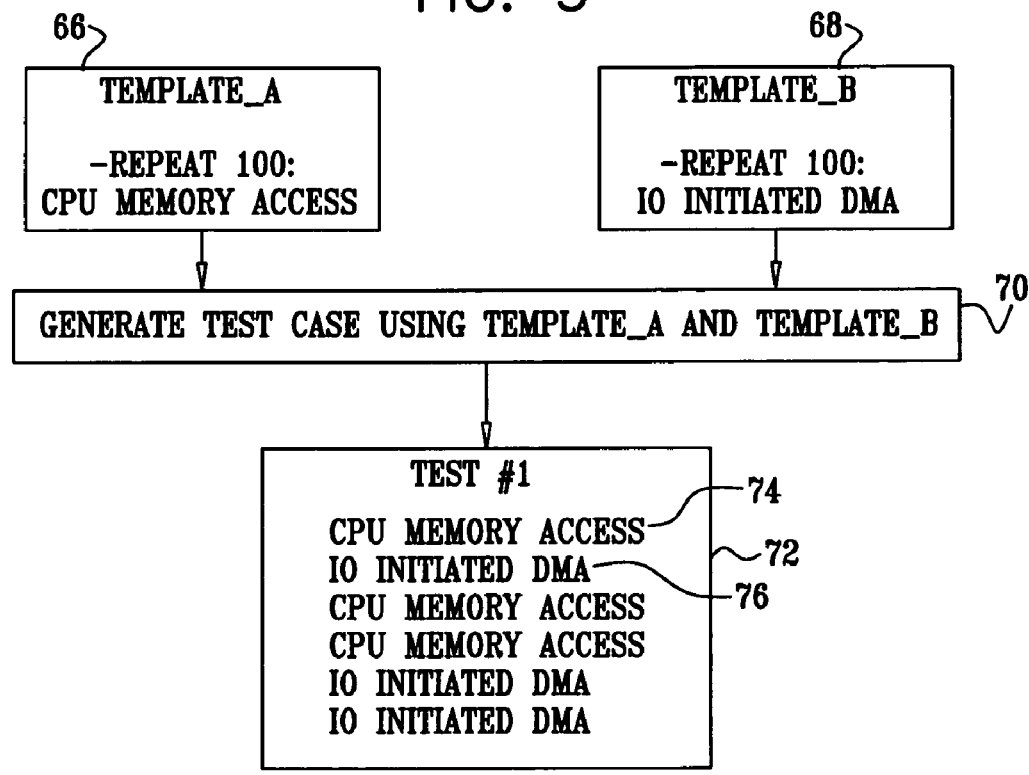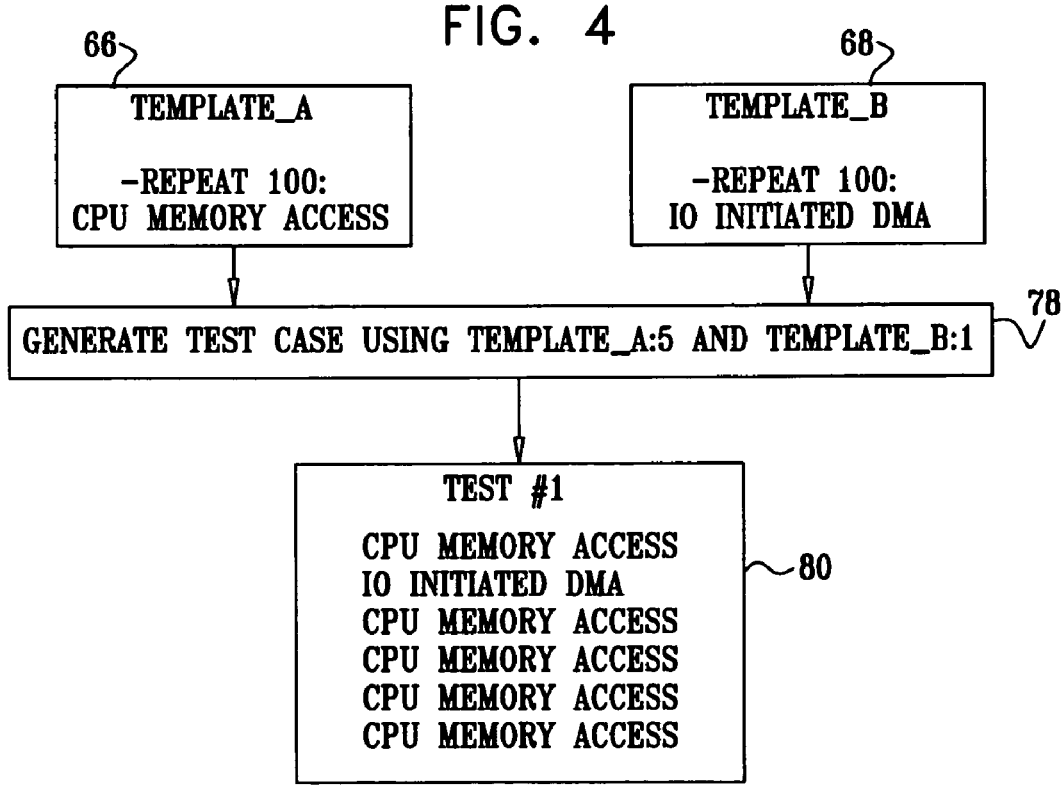

DYNAMICALLY INTERLEAVING RANDOMLY GENERATED TEST-CASES FOR FUNCTIONAL VERIFICATION

BACKGROUND OF THE INVENTION

1. Field of the Invention

This invention relates to functional verification of a design. More particularly, this invention relates to systems and methods for the efficient creation of test cases in order to verify combinations of several different functions of a hardware or software design.

2. Description of the Related Art

Functional verification is widely acknowledged to be a bottleneck in a hardware system's design cycle. Indeed, up to 70% of development time and resources are typically spent on functional verification. Allowing users to find design flaws, and fixing them in a subsequent release would be unwise and costly for three main reasons: (1) harm to reputation and brand-name; (2) a high cost of recall and replacement when there is a large installed base; and (3) litigation, should design flaws cause injury.

In current industrial practice, dynamic verification is the main functional verification technique for large and complex systems. Dynamic verification is accomplished by generating a large number of tests using random test generators, simulating the tests on the design-under-verification, and checking that the design-under-verification behaves according to its specification.

The rationale behind verification by simulation is that one acquires confidence in the correctness of a design-under-verification by running a set of test cases that encompass a sufficiently large number of different cases, which in some sense is assumed to be a representative sample of the full space of possible cases. The ability of the design-under-verification to correctly handle all cases is inferred from the correct handling of the cases actually tested. This approach is discussed, for example, in the document *User Defined Coverage—A Tool Supported Methodology for Design Verification,* Raanan Grinwald, Eran Harel, Michael Orgad, Shmuel Ur, and Avi Ziv, Proc. $38^{th}$ Design Automation Conference (DAC38), pages 158-163, 1998. When conducting simulations, it is desirable to define a particular subspace, which is considered to be "interesting" in terms of verification, and then to generate tests selected at random that cover the subspace.

Test cases developed by algorithms such as the foregoing are typically implemented on a test generator, which may optionally bias the tests based on internal testing knowledge. Such test generators are described in the following documents: *Model-Based Test Generation For Processor Design Verification,* Y. Lichtenstein, Y. Malka and A. Aharon, Innovative Applications of Artificial Intelligence (IAAI), AAAI Press, 1994; *Constraint Satisfaction for Test Program Generation,* L. Fournier, D. Lewin, M. Levinger, E. Roytman and Gil Shurek, Int. Phoenix Conference on Computers and Communications, March 1995; and *Test Program Generation for Functional Verification of PowerPC Processors in IBM,* A. Aharon, D. Goodman, M. Levinger, Y. Lichtenstein, Y. Malka, C. Metzger, M. Molcho and G. Shurek, $32^{nd}$ Design Automation Conference, San Francisco, June 1995, pp. 279-285.

The term coverage concerns checking and showing that testing has been thorough. Coverage is the prime measurement for the quality of a set of test cases. Simply stated, the idea in coverage is to create, in a systematic fashion, a large and comprehensive list of tasks, and to check that each task is executed in the testing phase. Ultimately, higher coverage implies greater chances of exposing a design flaw.

In complex systems, obtaining coverage that involves interaction among different functions is a particularly difficult task, as the interactions of different functions within the design can be non-determinative and difficult to reproduce.

SUMMARY OF THE INVENTION

There is provided, in accordance with an embodiment of the present invention, a framework for the generation of mixed function or combined test cases using a plurality of distinct test templates. The framework allows for dynamic interleaving of predefined test templates during test generation. An interface and a generation procedure enable a test case generator to randomly generate a single test case that combines several scenarios, each targeting a different function of the design-under-verification.

According to disclosed embodiments of the invention, the input for a test case generator is a plurality of test templates, each of which typically aims at covering a specific verification task. For example, tests that access the data cache of a processor can be specified by a test template that requires the test case generator to produce a series of store and load instructions.

It may be noted that the development of test templates is often a time consuming process, which requires a large investment of human effort. It is an advantage of some aspects of the invention that previously designed templates, known to be individually reliable, can be combined in many different interleavings in order to test interactions among different functions of the design.

One embodiment of the present invention provides a method for functional verification of a design under verification, which is carried out by providing a plurality of test templates, wherein the templates each specify test parameters directed to different functions of the design. The method is further carried out by producing a test case consisting of a series of transactions originating from respective ones of the templates by interleaving the test templates in a non-predetermined order. The transactions exercise in the order the respective functions of the design. The test case is submitted for execution by the design.

One aspect of the method includes assigning a weight to each of the templates, and determining the order probabilistically according to respective weights of the templates.

Another aspect of the method includes choosing one of the templates as a baseline template, wherein the step of producing a test case is performed until all of the transactions of the baseline template have been produced exactly one time.

In still another aspect of the method the step of producing a test case is performed until all other templates are generated an integer number of times.

In another aspect of the method at least one of the templates includes an unbreakable section, and while performing interleaving, the one template is repeatedly chosen to originate transactions successively until the unbreakable section is completed.

In another aspect of the method, the requirement for unbreakability can be relative, wherein one of said templates has a section having a transaction sparseness requirement. During interleaving, a predetermined range of transactions from other templates are required to be interspersed among transactions from the one template before the section can be completed.

According to a further aspect of the method, the templates comprise a first template and a second template, and in the order a number of occurrences of the first template between two occurrences of the second template does not exceed a predetermined value.

Yet another aspect of the method includes generating a prologue section of the test case prior to performing interleaving, wherein the prologue section includes a succession of transactions that originate from one of the templates.

Still another aspect of the method includes generating an epilogue section of the test case subsequent to performing interleaving, wherein the epilogue section includes a succession of transactions that originate from one of the templates.

According to an additional aspect of the method, the order is random.

One embodiment of the present invention provides a computer software product, including a computer-readable medium in which computer program instructions are stored, which instructions, when read by a computer, cause the computer to perform a method for functional verification of a design, which is carried out by accepting a plurality of test templates as an input, wherein the templates each specify test parameters directed to different functions of the design. The method is further carried out by producing a test case consisting of a series of transactions originating from respective ones of the templates by interleaving the test templates in a non-predetermined order. The transactions exercise in the order the respective functions of the design. The test case is submitted for execution by the design.

One embodiment of the present invention provides a verification system for functional verification of a design including a processor and a memory accessible by the processor, the processor is operative for performing the steps of accepting a plurality of test templates as an input, wherein the templates each specify test parameters directed to different functions of the design, producing a test case including a series of transactions originating from respective ones of the templates by interleaving the test templates in a non-predetermined order, wherein the transactions exercise in the order respective the functions of the design, and submitting the test case for execution by the design.

In one aspect of the verification system a global knowledge base is stored in the memory, wherein the processor is operative to apply the knowledge base to the plurality of test templates while producing a test case.

BRIEF DESCRIPTION OF THE DRAWINGS

For a better understanding of the present invention, reference is made to the detailed description of the invention, by way of example, which is to be read in conjunction with the following drawings, wherein like elements are given like reference numerals, and wherein:

FIG. 3 illustrates a simple example in which test templates are interleaved to produce a test case for a design-under-verification in accordance with a disclosed embodiment of the invention; and FIG. 4 illustrates a simple example in which test templates are interleaved to produce a test case for a design-under-verification in accordance with an alternate embodiment of the invention.

DETAILED DESCRIPTION OF THE INVENTION

In the following description, numerous specific details are set forth in order to provide a thorough understanding of the present invention. It will be apparent to one skilled in the art, however, that the present invention may be practiced without these specific details. In other instances, well-known circuits, control logic, and the details of computer program instructions for conventional algorithms and processes have not been shown in detail in order not to obscure the present invention unnecessarily.

Software programming code, which embodies aspects of the present invention, is typically maintained in permanent storage, such as a computer readable medium. In a client-server environment, such software programming code may be stored on a client or a server. The software programming code may be embodied on any of a variety of known media for use with a data processing system. This includes, but is not limited to, magnetic and optical storage devices such as disk drives, magnetic tape, compact discs (CD's), digital video discs (DVD's), and computer instruction signals embodied in a transmission medium with or without a carrier wave upon which the signals are modulated. For example, the transmission medium may include a communications network, such as the Internet. In addition, while the invention may be embodied in computer software, the functions necessary to implement the invention may alternatively be embodied in part or in whole using hardware components such as application-specific integrated circuits or other hardware, or some combination of hardware components and software.

System Overview.

Figure 1:
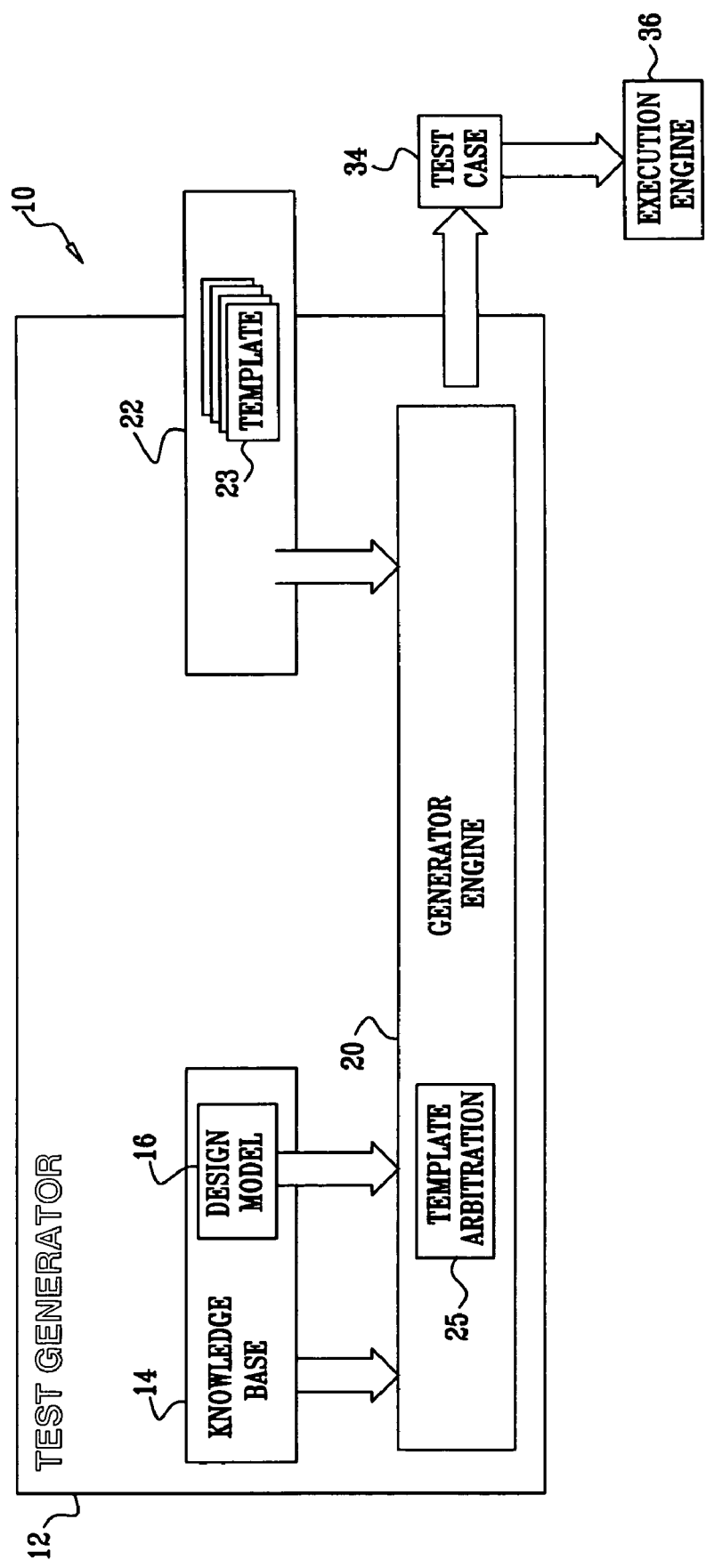
FIG. 1 is a high level block diagram of a design verification system, which is constructed and operative in accordance with a disclosed embodiment of the invention.

Turning now to the drawings, reference is initially made to FIG. 1, which is a high level block diagram of a design verification system 10, which is constructed and operative in accordance with a disclosed embodiment of the invention. The teachings of the present invention are not restricted to systems that are configured like the system 10, but are applicable to many testing systems that have architectures differing from the system 10.

The system 10, which is used for verifying an implementation of a design-under-verification. In the present embodiment, the design-under-verification is assumed to be a hardware design, but the design-under-verification may alternatively comprises software or combinations of hardware and software elements. The system 10 has several basic interacting components, which enable the creation of tests that have various degrees of randomness. The system 10 is typically realized as a computer that includes a processor and a memory that contains objects corresponding to the functional blocks depicted in FIG. 1. At the heart of the system 10 is a test generator 12. The ability of the test generator 12 to introduce random unspecified values is generally desirable, since design flaws in practice are usually unpredictable.

Typically, an abstract knowledge base 14 holds a formal description of the specification of the design-under-verification. This specification may be stored in a database, which may also incorporate testing knowledge of the system design, and may include testing constraints and coverage criteria. The design-under-verification could be any module, e.g., a computer processor, bus-bridge, or DMA controller. The knowledge base 14 includes a general model 16 of a design-under-verification that includes testing knowledge that is helpful in providing test coverage and biasing the generator toward "interesting" cases. It is possible to apply the principles of the inventions in systems in which the knowledge base 14 is omitted.

A test generator engine 20 has a user input 22, through which a plurality of test templates 23 are submitted. The templates 23 each specify test parameters, directed to different functions of the design-under-verification. These parameters are used for the production of many distinct transactions, which are the atomic functional building blocks of the design-under-verification. Several transactions originating from different test templates may be combined together in complex statements in order to achieve a more complex scenario. A simple example is: "Generate 300 to 500 transactions of either a CPU access to memory or an I/O initiated interrupt." Test templates directed to each of these functions are submitted to the test generator, whereupon the test generator dynamically interleaves them in a non-predetermined order, and generates a large number of distinct, well distributed test cases or transactions, in which different functions are exercised in combinations, in compliance with the user's specification. Variation among different test cases is achieved through a large number of random decisions made during the generation process. It should be noted that the testing knowledge in the knowledge base 14 is global, in the sense that it may be applied by the test generator 12 across more than one of the templates 23. For example, the global testing knowledge can be used to constrain two different templates to access the same randomly selected resource, thereby increasing the quality of the generated test case.

A template arbitrator unit 25 is included in the test generator engine 20. This unit has the function of choosing the template for which the next transaction is generated. The template arbitrator unit 25 operates independently, in the sense that other components of the test generator engine 20 need not be aware of its internal operations.

Many generic test generator engines are suitable for the test generator engine 20, suitably modified to permit application of the principles of the invention, which may be accomplished by those skilled in the art. For example, a suitable generator for use as the test generator engine 20 is disclosed in commonly assigned Published U.S. patent application Ser. No. 10/040,940 (Publication No US 2003/0130813 A1), now U.S. Pat. No. 6,925,405, entitled Adaptive Test Program Generation, which is herein incorporated by reference.

The test case 34 is executed by an execution engine 36 on an implementation of the design-under-verification. The execution engine 36 can be a simulator of the design-under-verification, or a realization of the design.

Combined Test Cases

A verification plan for a design-under-verification contains various tasks that cover different functions of the design. In many cases, it is desirable to test these functions in conjunction with one another. In general, test cases that cover different functions are referred to herein as "combined test cases."

EXAMPLE 1

For example, consider a multi-processor system with an I/O subsystem—it would be desirable to have a test case that targets cache operations for the processors, and at the same time tests direct memory accesses (DMA) coming from an I/O device.

EXAMPLE 2

In another example, assume that a computer employing a single processor has been previously verified through the construction of test templates, each directed to particular functions of the design-under-verification. Now a multiprocessor version is to be verified, in which software can selectively disable or enable one or more processors as a function of computational load. It is now necessary to test the processor enable/disable functions in combination with all the other functions of the single processor version. As will be seen from the discussion that follows, according to some aspects of the invention, test templates, which were originally constructed for the single processor version, can be reused and combined with a new template that is directed to the processor enable/disable functions. The old and new templates are interleaved so as to test complex scenarios involving different numbers of operating processors.

Yet another common requirement is to interleave highly specified sequences with a large set of existing test cases. For example, highly specialized sequences that change various aspects of the configuration of the system could be injected on-the-fly while different transactions are occurring.

In order to create combined test cases it may be possible to use the following methods, which are presented together with their disadvantages:

(1) Generate several different tests independently and combine them together manually or through a postprocess script. Test integration is a costly process, which is highly sensitive to changes in the simulation environment. Furthermore, the resulting test case generally cannot contain any interesting events involving more than one function, since the original tests were generated independently of one another.

(2) Write a large set of test templates that represent the cross product of the verified functions. This method requires creation and maintenance of a very large set of test templates. The flexibility in creating scenarios that mix different functions is limited and each such scenario requires duplication of existing test templates. Most importantly, any changes related to a specific function would need to be propagated to a large number of test templates.

(3) Create a combined test template by concatenating several existing test templates and feed the combined test template to the test case generator. Often, a special effort is required to build a syntactically correct test template. Additionally, the different scenarios would be generated sequentially and not interleaved. This prevents the test case generator from leveraging proximity in generation time to create interesting events in a complex scenario.

(4) Mix stimuli coming form several distinct and independent agents in the system. The main shortcoming of this method is that it lacks the advantages of coordinated stimuli, specifically, interesting scenarios that involve actions coming from several different agents. Moreover, this method is useless for interleaving scenarios of different transactions coming from a single agent (e.g., A processor doing cache operations and memory-mapped I/O at the same time).

In summary, all the above-noted techniques suffer from low flexibility and costly maintenance. In addition, when using such methods, it is practically impossible to cope with changes in the verified design and verification requirements. These drawbacks become even more evident when trying to reuse existing test templates to verify a follow-on or a similar design.

According to the invention dynamic interleaving of predefined test templates, each targeting a different function of the verified design, is performed.

Dynamic Interleaving of Test Templates.

Continuing to refer to FIG. 1, in order to enable dynamic interleaving of predefined scenarios the test generator 12 accepts N distinct templates 23 as an input and produces a test case 34 with a mixture of the scenarios defined in each of the templates. Each of the test templates is directed to exercising a particular function of the design-under-verification. For example, a template directed to cache memory accesses contains sufficient information to cause the test generator to write instructions effecting a predetermined number of cache memory accesses.

Figure 2:
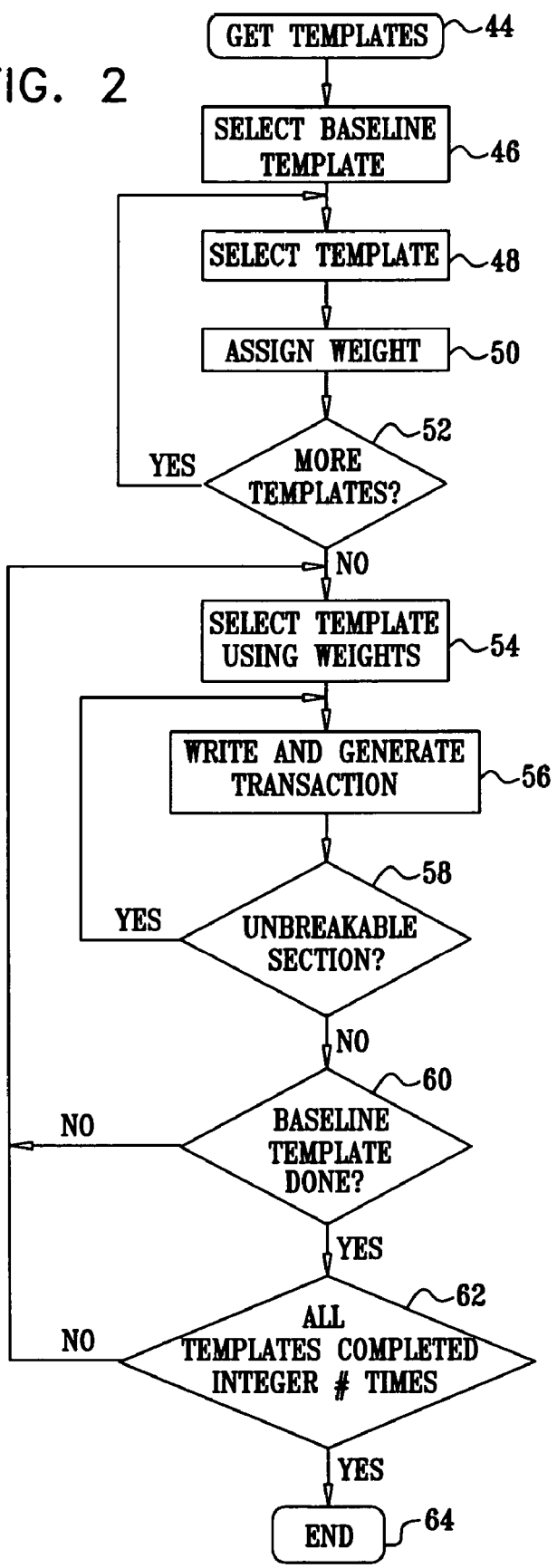
FIG. 2 is a flow chart of a method of generating test cases for a design-under-verification by interleaving test templates in accordance with a disclosed embodiment of the invention.

Reference is now made to FIG. 2, which is a flow chart of a method of generating test cases for a design-under-verification by interleaving a plurality of test templates in accordance with a disclosed embodiment of the invention. At initial step 44, all test templates being currently used are read by a test generator.

Next, at step 46 one of the templates obtained in initial step 44 is selected as a baseline template. Normally this is the first template that is encountered in the set of templates. This is necessary in order to assign weights to the other templates if different weights are to be assigned to the participating templates. The baseline template is given a normalized weight, and its transactions are to be fully generated exactly one time. For instance, if the baseline template specifies 100 memory accesses, program instructions corresponding to one of the memory access are generated each time the baseline template appears in the order of interleaving. When the baseline template has appeared 100 times in the order of interleaving, 100 memory accesses have been generated.

Next, at step 48, one of the templates is selected from the group obtained in initial step 44.

Next, at step 50, a weight is assigned to the template that was selected in step 48. Typically, this step is performed by a human engineer, although in some applications it may be performed automatically, using random weight assignment, or an algorithm. The weight assignments that occur in step 50 permit different emphasis to be placed on different templates.

Control now proceeds to decision step 52, where it is determined if more templates remain to be assigned weights. If the determination at decision step 52 is affirmative, then control returns to step 48.

If the determination at decision step 52 is negative, then control proceeds to step 54, where one of the templates obtained in initial step 44 is selected for use in test generation. In general, this selection is a weighted selection, made probabilistically according to the respective weights previously assigned to the various templates. In some cases, the selection is influenced by considerations of transaction sparseness, which is explained below. In different iterations of step 54, different templates may be selected. It should be emphasized that the baseline template chosen in step 46 has some probability of being selected in step 54, according to its assigned weight.

Completely random interleaving can be effected by simply assigning identical weights to all the templates in steps 46, 50.

Next, at step 56 the current template is processed, either on-the-fly, or alternatively in a batch mode to produce a single transaction, which is first generated by the test generator and then written out. For example, if the current template specifies 100 memory accesses, the transaction produced in step 56 will result in instructions that effect one of the memory accesses in test cases produced by the test generator. Of course, due to random considerations in test generation, the memory addresses may vary in different test cases and in different iterations of step 56 in which the same template is applied. It will be apparent that the current template will not have completed until it has been selected 100 times in step 54.

In some cases test templates contain sequences that cannot tolerate intervention of foreign transactions. In these cases the corresponding section of the test template is marked as "unbreakable." The test generator 12 (FIG. 1) does not generate any transaction from another template until the generation of an unbreakable section completes. An example of an unbreakable section is a series of accesses to consecutive addresses in memory. Verification of this scenario would be compromised if a transaction from another template were to access an unrelated address during generation of the series. In some embodiments, the requirement for unbreakability is not always absolute. Rather it can be relative, to require a given degree of transaction sparseness. It is possible to require that a range of foreign transactions, i.e., no more than M and no less than N foreign transactions, be generated within a specific scope. This is especially relevant in the context of injecting a specific scenario into existing templates. For example, one may want to assure that 5-15 transactions will occur between the time a processor's clock rate is reduced and the time it is restored to normal. In such cases a record of intervening foreign transactions for the current section is maintained, and if a requirement for transaction sparseness would be violated, a fatal error would have occurred and the generation procedure would be aborted.

Control now proceeds to decision step 58, where it is determined if the operation that was performed respecting the current template is in an unbreakable section. If the determination at decision step 58 is affirmative, then control returns to step 56. The current template will continue to be processed until the unbreakable section is exited.

If the determination at decision step 58 is negative, then control proceeds to decision step 60. It will be recalled that the baseline template has a certain probability of selection. Now it is determined if all transactions specified in the baseline template have been produced. If the determination at decision step 60 is negative, then control returns to step 54, where another template is chosen by weighted selection. If other templates have already completed, they may need to be "rewound" and restarted so that they can continue to qualify for selection in step 54.

If the determination at decision step 60 is affirmative, then control proceeds to decision step 62, where it is determined if all the other templates have completed an integer number of times. This step is necessary because the procedure must not end leaving any templates incomplete. At this point the baseline template, and any other template, which has completed an integer number of times becomes disqualified from further selection in new iterations of step 54.

If the determination at decision step 62 is negative, then control returns to step 54.

If the determination at decision step 62 is affirmative, then control proceeds to final step 64. The method terminates.

---

Listing 1

```
S <-- GetAllTemplates ( )
baseline_template <- GetBaseline(S)
While !Completed (baseline_template)
    if IsBreakable (current_template) then
        current_template <- WeightedChoice (S)
    GenerateSingleTransaction (current_template)
    WriteTransactionToTestCase ( )
```

---

A simplified version of the method described with respect to FIG. 2 can be expressed in pseudocode, as shown in Listing 1. The method has a number of advantages:

(1) It is possible to inject specific sequences into a large preexisting set of general test templates with minimal extra effort. This allows the creation of randomly interleaved scenarios that in practice cannot be generated using a single targeted test template.

(2) Development and maintenance of test template pools are simplified. Each template addresses a specific well-defined functionality while the interleaving mechanism allows for creation of a versatile range of test cases.

(3) Test templates can be easily reused. One may write a distinct test template for a given verification task and use the mechanism to create a randomly interleaved test cases. It is also possible to reuse a relevant subset of the test case pool in a similar or a follow-on project.

(4) New functions added to the verification plan can be easily integrated into the verification environment. Additionally, changes in existing functions are easy to absorb as they require only localized adaptations.

(5) This approach allows for a bottom up verification process: first, distinct functions are separately tested; second, the functions are combined to produce more complex scenarios.

(6) A common generation state and global knowledge of the test case generator support the creation of interesting inter-scenario events. It will be recalled from the discussion of FIG. 1 that the test case generator holds global knowledge of the state of the design and generation process resources. This knowledge can be leveraged to create events that involve more than one test template at a time. An example of such an inter-scenario event is the generation of address collisions between CPU accesses to memory originating from one template and DMA's that target the same memory addressees, but originate from another template.

EXAMPLE 3

Reference is now made to FIG. 3, which is a diagram illustrating a simple example of interleaving test templates to produce a test case for a design-under-verification in accordance with a disclosed embodiment of the invention. In this example, there are two templates 66, 68. The template 66 specifies that the test generator 12 (FIG. 1) is to generate instructions that perform 100 CPU-initiated memory accesses. The template 68 specifies the generation of instructions that result in 100 I/O initiated direct memory accesses (DMA). In block 70, representing a random test generator, the templates 66, 68 are interleaved in a random manner that is nevertheless consistent with any constraints imposed by the model 16.

Alternatively, a relative weight for each of the templates 66, 68 can be assigned. The test generator 12 then generates transactions according to the assigned weight ratios. In general, in order to comply with the assigned weights, transactions corresponding to one or more templates may need to be generated multiple times. The number of generated transactions should be an integer, in order to keep the semantics of the scenarios specified in the templates intact. In such cases, one of the templates is defined as a baseline template, and is generated exactly once.

In any case, the test generator 12 produces a test case, which is a mixture of transactions specified by the templates 66, 68, as shown in block 72. For example, in the program listing of block 72, a first instruction 74 was specified by the template 66, and a second instruction 76 was specified by the template 68.

EXAMPLE 4

Reference is now made to FIG. 4, which is a diagram illustrating an example of interleaving test templates to produce a test case for a design-under-verification in accordance with an embodiment of the invention. The templates 66, 68, and the scheme of generating a test case are the same as shown in FIG. 3. However in block 78, in which interleaving occurs, the weights are assigned to the templates 66, 68 in a ratio of 5:1. As a result, the interleaved instructions that appear in the program listing of block 80 are weighted such that the ratio of instructions attributable to the templates 66, 68 are 5:1, respectively.

Alternative Embodiments

In order to refine control over the interleaving patterns one may limit the number of interleavings of a given test template within other test templates. Referring again to the discussion above in which a multiprocessor design is to be verified, one could limit the number of processor disable sequences that would be allowed to occur between the transactions of another test template.

It is also possible to define sections of a given test template to be generated at the beginning or end of the test case, in case the template is being repeated. Such sections are marked as "Prologue" or "Epilogue" accordingly. If present, the prologue and epilogue are respectively generated before and after dynamic interleaving of the templates. There may be multiple prologue and epilogue sections, each contributed by one of the templates.

It will be appreciated by persons skilled in the art that the present invention is not limited to what has been particularly shown and described hereinabove. Rather, the scope of the present invention includes both combinations and sub-combinations of the various features described hereinabove, as well as variations and modifications thereof that are not in the prior art, which would occur to persons skilled in the art upon reading the foregoing description.

The invention claimed is:

1. A method for functional verification of a design comprising the steps of:

providing a processor and a memory accessible to the processor in which computer program instructions are stored, the instructions comprising distinct software modules including a test generator engine, the processor operative under control of the instructions for:

defining respective first and second templates directed to first and second sets of functions of the design;

operating the test generator engine to prepare first and second test cases from the first and second templates, respectively;

using the first test case, operating an execution engine a first time to verify the first set of functions in the design;

using the second test case, operating the execution engine a second time to verify the second set of functions in the design;

after performing the steps of operating the execution engine a first time and a second time, interleaving instances of the first and second templates in a nonpredetermined order, using a template arbitrator; wherein said non-predetermined order a number of occurrences of the first templates between occurrences of the second templates does not exceed a predetermined value;

processing the interleaved first and second templates in the test generator engine to prepare a combined test case, wherein invocations of the first set of functions are correspondingly interleaved with invocations of the second set of functions; and using the combined test case, operating the execution engine a third time to verify the first and second sets of functions in combination.

2. The method according to claim 1, further comprising the steps of:

assigning a weight to each of the first and second templates; and determining the nonpredetermined order probabilistically according to respective weights of the first and second templates.

3. The method according to claim 1, wherein interleaving instances of the first and second templates is performed until at least a first predetermined number of instances of the first templates and at least a second predetermined number of instances of the second templates have been interleaved.

4. The method according to claim 1, further comprising the step of generating a prologue section of the combined test case, wherein the prologue section comprises a succession of transactions that originate from one of the first and second templates.

5. The method according to claim 1, further comprising the step of generating an epilogue section of the combined test case, wherein the epilogue section comprises a succession of transactions that originate from one of the first and second templates.

6. The method according to claim 1, wherein the nonpredetermined order is random.

7. A method for functional verification of a design comprising the steps of:

providing a processor and a memory accessible to the processor in which computer program instructions and data objects are stored, the data objects comprising a knowledge base holding a model of the design, the instructions comprising distinct software modules including a test generator engine, and a template arbitrator, the processor accessing the knowledge base under control of the instructions and operative for:

defining respective first and second templates directed to first and second sets of functions of the design;

operating the test generator engine to prepare first and second test cases from the first and second templates, respectively;

using the first test case, operating an execution engine a first time to verify the first set of functions in the design;

using the second test case, operating the execution engine a second time to verify the second set of functions in the design;

after performing the steps of operating the execution engine a first time and a second time, interleaving instances of the first and second templates in a nonpredetermined order, using the template arbitrator;

preparing a new version of the design;

processing the interleaved first and second templates in the test generator engine to prepare a combined test case for the new version of the design, wherein invocations of the first set of functions are correspondingly interleaved with invocations of the second set of functions; and using the combined test case , operating the execution engine a third time to verify the first and second sets of functions in combination in the new version of the design.

8. The method according to claim 7, further comprising the steps of:

assigning a weight to each of the first and second templates; and determining the nonpredetermined order probabilistically according to respective weights of the first and second templates.

9. The method according to claim 7, wherein interleaving instances of the first and second templates is performed until at least a first predetermined number of instances of the first templates and at least a second predetermined number of instances of the second templates have been interleaved.

10. The method according to claim 7, wherein in said nonpredetermined order a number of occurrences of the first templates between occurrences of the second templates does not exceed a predetermined value.

11. The method according to claim 7, further comprising the step of generating a prologue section of the combined test case, wherein the prologue section comprises a succession of transactions that originate from one of the first and second templates.

12. The method according to claim 7, further comprising the step of generating an epilogue section of the combined test case, wherein the epilogue section comprises a succession of transactions that originate from one of the first and second templates.

13. The method according to claim 7, wherein the nonpredetermined order is random.

* * * * *

UNITED STATES PATENT AND TRADEMARK OFFICE
CERTIFICATE OF CORRECTION

| | | |
|---|---|---|
| PATENT NO. | : 7,627,843 B2 | Page 1 of 1 |
| APPLICATION NO. | : 11/087466 | |
| DATED | : December 1, 2009 | |
| INVENTOR(S) | : Dozorets et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 765 days.

Signed and Sealed this

Second Day of November, 2010

David J. Kappos
*Director of the United States Patent and Trademark Office*